(12) United States Patent
Sato et al.

(10) Patent No.: US 11,602,766 B2
(45) Date of Patent: *Mar. 14, 2023

(54) ELECTRONIC COMPONENT MANUFACTURING METHOD AND APPARATUS

(71) Applicant: Creative Coatings Co., Ltd., Tokyo (JP)

(72) Inventors: Eiji Sato, Tokyo (JP); Hitoshi Sakamoto, Nagaoka (JP)

(73) Assignee: Creative Coatings Co., Ltd., Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 17/348,682

(22) Filed: Jun. 15, 2021

(65) Prior Publication Data

US 2021/0308717 A1    Oct. 7, 2021

Related U.S. Application Data

(62) Division of application No. 16/503,288, filed on Jul. 3, 2019, now Pat. No. 11,052,422.

(30) Foreign Application Priority Data

Jul. 10, 2018 (JP) .............................. JP2018-130961
Sep. 10, 2018 (JP) .............................. JP2018-168952

(51) Int. Cl.
  *B05D 1/00* (2006.01)
  *B05D 1/18* (2006.01)
  (Continued)

(52) U.S. Cl.
  CPC ................. *B05D 1/18* (2013.01); *B05C 3/09* (2013.01); *B05C 13/02* (2013.01); *H01C 17/28* (2013.01);
  (Continued)

(58) Field of Classification Search
  CPC .................................... B05D 1/00; H05K 1/00
  See application file for complete search history.

(56) References Cited

U.S. PATENT DOCUMENTS 5,254,362 A * 10/1993 Shaffer ................ H05K 3/1233
                                                         427/98.2
2003/0136577 A1    7/2003 Abe

FOREIGN PATENT DOCUMENTS

JP        A6345813        2/1988
JP        04-291712       10/1992
(Continued)

*Primary Examiner* — David P Turocy
*Assistant Examiner* — Mohammad Mayy
(74) *Attorney, Agent, or Firm* — Nolan Heimann LLP; David L. Hoffman

(57) ABSTRACT

An electronic component manufacturing method includes a blotting process of bringing a conductive paste applied to an end portion of each electronic component body held by a jig into contact with a surface of a surface plate. The blotting process includes simultaneous performance of a distance changing process of changing the distance between an end face of each electronic component body and the surface of the surface plate and a position changing process of changing a two-dimensional position where the end face of the electronic component body is projected on the surface of the surface plate in such a manner that the direction of the movement of two-dimensional position in parallel to the surface of the surface plate successively varies (e.g., along a circular path).

10 Claims, 10 Drawing Sheets

(51) Int. Cl.
*H01G 13/00* (2013.01)
*H01C 17/28* (2006.01)
*H05K 1/18* (2006.01)
*B05C 3/09* (2006.01)
*B05C 13/02* (2006.01)
*H01G 2/06* (2006.01)
*H01G 4/005* (2006.01)

(52) U.S. Cl.
CPC ............... *H01G 2/06* (2013.01); *H01G 4/005* (2013.01); *H01G 13/006* (2013.01); *H05K 1/185* (2013.01)

(56) References Cited

FOREIGN PATENT DOCUMENTS

| | | |
|---|---|---|
| JP | 05-182879 | 7/1993 |
| JP | A2002237403 | 8/2002 |
| JP | A2016100459 | 5/2016 |
| WO | 2018070093 A1 | 4/2018 |

\* cited by examiner

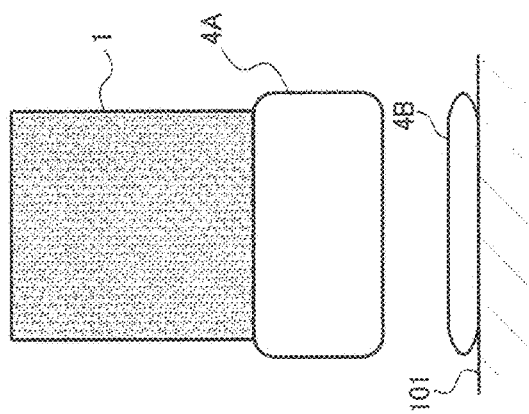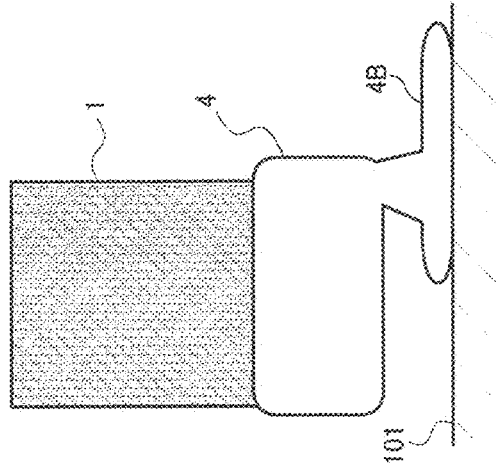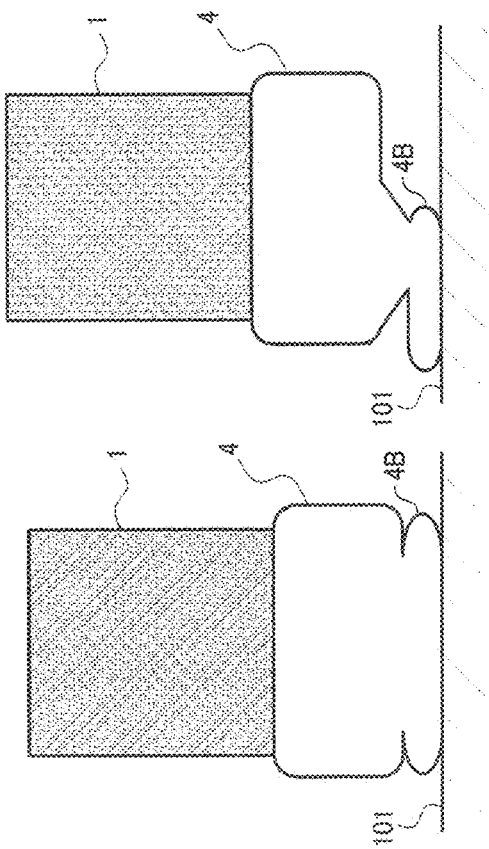

FIG. 13

| BLOTTING PROCESS / CHIP | COMPARATIVE EXAMPLE 1 | COMPARATIVE EXAMPLE 2 | PRESENT EMBODIMENT |
|---|---|---|---|
| ELECTRONIC COMPONENT BODY 1b (REFERENCE CHIP) | TOP FILM THICKNESS: 30 μm | TOP FILM THICKNESS: 22 μm | TOP FILM THICKNESS: 12 μm |
| ELECTRONIC COMPONENT BODY 1a (CHIP 20 μm LONGER THAN REFERENCE CHIP) | TOP FILM THICKNESS: 22 μm | TOP FILM THICKNESS: 15 μm | TOP FILM THICKNESS: 10 μm |
| RESULT | DIFFERENCE: 8 μm ADHESION IS THICK IF CHIP IS SHORT | DIFFERENCE: 7 μm ALMOST UNIFORM EXCEPT SOME VARIATION | DIFFERENCE: 2 μm VARIATION DUE TO SIZE DIFFERENCE IS REDUCED |

ELECTRONIC COMPONENT MANUFACTURING METHOD AND APPARATUS

This application is based upon and claims the benefit of priority to Japanese Patent Application No. 2018-130961, filed on Jul. 10, 2018, and Japanese Patent Application No. 2018-168952, filed on Sep. 10, 2018, the entire contents of which are incorporated herein by reference.

BACKGROUND

The present disclosure relates to an electronic component manufacturing method and an electronic component manufacturing apparatus.

The present inventors have proposed an apparatus and method for forming an external electrode on an electronic component body, such as a laminated ceramic capacitor, an inductor, or a thermistor, by dip coating a conductive paste layer on an end face of this electronic component body (JP-A-2002-237403). The film thickness of the conductive paste layer as it is dip-coated cannot be made uniform. Therefore, it is conventionally proposed to pull up an electronic component body dip-coated with the conductive paste from a conductive paste film layer formed on a surface plate and then bring a saggy portion of the conductive paste formed on an end portion of the electronic component body into contact with the surface plate from which the conductive paste film layer has been removed (JP-A-63-45813). This process is referred to as a blotting process because extra conductive paste on the electronic component body is wiped off by the surface plate.

BRIEF DESCRIPTION OF THE DRAWINGS

FIGS. 6A to 6D are diagrams illustrating, as a first embodiment of the disclosure, operations in the blotting process illustrated in FIG. 5A;

FIG. 13 is a diagram illustrating data obtained by evaluating blotting processes of the present embodiment and two comparative examples.

DESCRIPTION OF EXEMPLARY EMBODIMENTS

Figure 1:
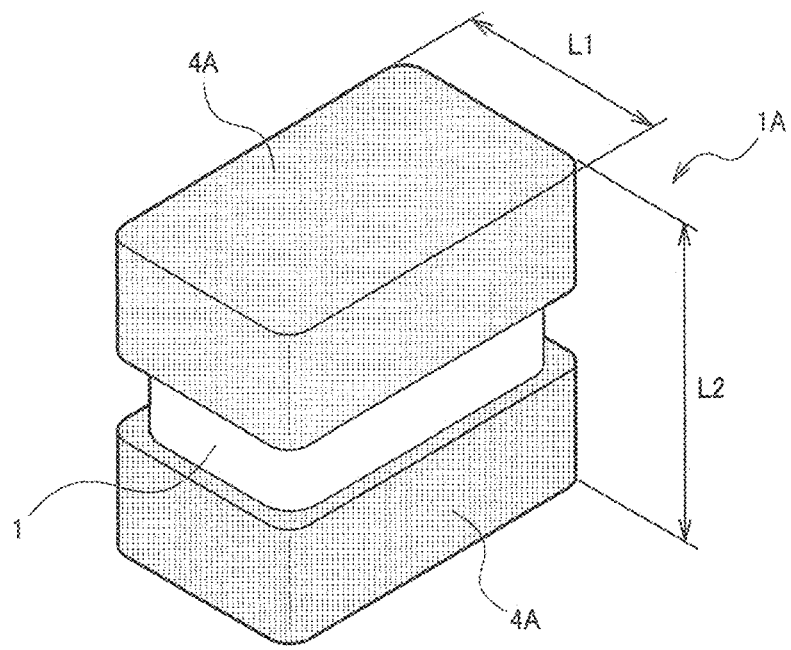
FIG. 1 is a diagram illustrating, as an embodiment of the disclosure, an exemplary electronic component manufactured by an electronic component manufacturing apparatus according to an electronic component manufacturing method.

The following disclosure provides many different embodiments, or examples, for implementing different features of the provided subject matter. These are, of course, merely examples and are not intended to be limiting. In addition, the disclosure may repeat reference numerals and/or letters in the various examples. This repetition is for the purpose of simplicity and clarity and does not in itself dictate a relationship between the various embodiments and/or configurations discussed. Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between. Further, when the first element is described as "moving" relative to the second element, such description includes embodiments in which at least one of the first element and the second element moves relative to the other.

The disclosure intends to provide an electronic component manufacturing method and an electronic component manufacturing apparatus, in which the blotting process is further improved, based on intensive studies on the cause of non-uniform conductive paste layers formed on ends of electronic component bodies.

(1) According to one aspect of the disclosure, there is provided an electronic component manufacturing method comprising:

blotting of bringing a conductive paste applied to an end portion including an end face of an electronic component body held by a jig into contact with a surface of a surface plate, thereby transferring extra conductive paste to the surface plate, the blotting including simultaneous performance of:

distance changing of changing a distance between the end face of the electronic component body and the surface of the surface plate, and position changing of changing a two-dimensional position where the end face of the electronic component body is projected on the surface of the surface plate in such a manner that the movement direction of the two-dimensional position successively varies in a plane parallel to the surface of the surface plate.

According to the aspect (1) of the disclosure, by implementing the position changing, the movement direction of the electronic component body relative to the surface plate successively varies in the plane parallel to the surface plate. Here, although the extra conductive paste on the electronic component body is dragged by the surface plate or the conductive paste transferred to the surface plate, the extra conductive paste is easily scraped off since the direction of dragging successively varies. Further, the aspect (1) of the disclosure does not cause a problem such that the extra conductive paste stays downstream in the movement direction, as in the case of linear movement in which the relative movement direction does not successively vary, and the film thickness of the conductive paste layer is locally thickened. Further, when the end face of the electronic component body is rectangular, the extra conductive paste is easily collected at the corner portion and it becomes easy to secure the film thickness of the conductive paste at the corner portion. In addition, implementation of the distance changing can adjust the amount of the conductive paste to be brought into contact with the surface plate during the blotting. Therefore, depending on the film thickness of the conductive paste to be secured for the electronic component body, the film thickness can be selectively adjusted by shortening or extending the distance in the distance changing. This blotting is such that the extra conductive paste is scraped off during the blotting including the distance changing and the position changing, and the conductive paste does not draw threads after the blotting.

The blotting may be performed simultaneously for a plurality of electronic component bodies held by a jig. Further, the blotting may be performed after applying a conductive paste in advance on the surface of the surface plate to form a wet layer of the conductive paste on the surface of the surface plate. In this case, in the blotting, the extra conductive paste on the electronic component body is brought into contact with the wet layer formed on the surface of the surface plate. The extra conductive paste of the electronic component body is easily transferred to the wet layer of the same conductive paste layer rather than a dry surface of the surface plate mainly formed of metal.

(2) In the aspect (1) of the disclosure, in the position changing, the movement locus of the two-dimensional position draws a loop, and in the blotting, the electronic component body can be spirally moved relative to the surface of the surface plate. As a result, while minimizing the required area of the surface plate, the position changing can be efficiently implemented.

(3) In the aspect (1) or (2) of the disclosure, the distance changing can extend the distance between the end face of the electronic component body and the surface of the surface plate. In this case, the electronic component body relatively moves in a direction away from the surface plate during the blotting. Therefore, the amount of the conductive paste transferred to the surface plate is reduced, and a relatively thick film thickness of the conductive paste of the electronic component body can be secured.

(4) In the aspect (1) or (2) of the disclosure, the distance changing can shorten the distance between the end face of the electronic component body and the surface of the surface plate. In this case, the electronic component body relatively moves in a direction approaching the surface plate during the blotting. Therefore, the amount of the conductive paste transferred to the surface plate is increased, and a relatively thin film thickness of the conductive paste of the electronic component body can be secured. Further, the distance changing may extend the distance between the end face of the electronic component body and the surface of the surface plate after shortening the distance between the end face of the electronic component body and the surface of the surface plate.

(5) Another aspect of the disclosure relates to an electronic component manufacturing method including blotting of bringing a conductive paste applied to an end portion including an end face of each of a plurality of electronic component bodies held by a jig into contact with a surface of a surface plate. In the blotting, a height changing of shortening the distance between a end face of each the plurality of electronic component bodies and the surface of the surface plate and a position changing of changing a two-dimensional position where the end face of each of the plurality of electronic component bodies is projected on the surface of the surface plate at different heights set by the height changing are performed by causing the jig and the surface plate to relatively move.

According to the aspect (5) of the disclosure, the plurality of electronic component bodies are relatively moved to approach the surface plate during the height changing and the plurality of electronic component bodies are relatively moved in a direction parallel to the surface plate during the position changing. Here, the positions of the end faces of the plurality of electronic component bodies held by the jig may vary. In this case, if the height changing is not performed, the blotting is performed while maintaining the height position of the jig with respect to the surface of the surface plate. In this case, the blotting is performed in a state where electronic component bodies shorter in distance from the surface of the surface plate to the end face and electronic component bodies longer in distance from the surface of the surface plate to the end face are mixed. This impedes the uniformity of the shape of the conductive paste layer applied to the end portions of the plurality of electronic component bodies. The implementation of the position changing at different heights set by the height changing according to another aspect of the disclosure can equalize the conductive paste layers formed on the end faces of the plurality of electronic component bodies to have a required thickness regardless of variation in position of the end faces of the plurality of electronic component bodies. As a result, the conductive paste layers formed on the end portions of the plurality of electronic component bodies are made uniform in shape.

(6) In another aspect (5) of the disclosure, the blotting can include simultaneous performance of the height changing and the position changing. In this case, while the plurality of electronic component bodies relatively move closer to the surface plate, the plurality of electronic component bodies are relatively moved with the component in the direction parallel to the surface plate. As a result, the conductive paste layers are made uniform in thickness even when the positions of the end faces of the plurality of electronic component bodies held by the jig are irregular in variation amount.

(7) In another aspect (6) of the disclosure, the height changing and the position changing to be simultaneously performed can cause the plurality of electronic component bodies to relatively approach the surface of the surface plate while moving spirally. As a result, the position changing can be efficiently implemented while minimizing the required area of the surface plate. Further, during the blotting, the relative movement direction of the electronic component body with respect to the surface plate successively varies in the plane parallel to the surface plate. As a result, the surface plate or the conductive paste transferred to the surface plate drags the conductive paste from the electronic component body, and the extra conductive paste can be transferred from the electronic component body to the surface plate.

(8) Another aspect of the disclosure relates to an electronic component manufacturing method including coating of applying the conductive paste to an end portion of each of the plurality of electronic component bodies held by the jig by bringing the end portion including the end face of each of the plurality of electronic component bodies into contact with a dip layer of the conductive paste formed on the surface of a first surface plate, wherein the coating includes bringing the end face of each of the plurality of electronic component bodies into contact with the surface of the first surface plate by causing relative movement of the jig and the first surface plate, the jig elastically holding the plurality of electronic component bodies so as to be movable in a direction perpendicular to the surface of the first surface plate.

According to the aspect (8) of the disclosure, the relative movement of the jig elastically holding the plurality of electronic component bodies and the first surface plate brings the end face of each of the plurality of electronic component bodies into contact with the surface of the first surface plate. Here, even in a case where the positions of the end faces of the plurality of electronic component bodies held by the jig vary, the jig elastically holding the electronic component body causes the electronic component body having first come in contact with the surface of the first surface plate to retract in the direction perpendicular to the surface of the first surface plate. In this case, all the end faces of the electronic component bodies can contact the surface of the first surface plate. As a result, in all the electronic component bodies, the coating length of the conductive paste on the side surface rising from the end face can be equalized. Thus, the conductive paste layers formed on the end portions of the electronic component bodies can be made uniform in shape.

(9) Further, in the aspect (8) of the disclosure, after the coating using the first surface plate, the blotting according to the aspect (5) of the disclosure using a second surface plate can be performed. As a result, the conductive paste layers formed on the end faces of the electronic component bodies are made uniform in thickness.

(10) In another aspect (9) of the disclosure, the first surface plate from which the dip layer formed on the surface has been removed can be also used as the second surface plate. As a result, the apparatus implementing this manufacturing method can be miniaturized.

(11) Another aspect of the disclosure relates to an electronic component manufacturing apparatus that includes a jig for holding an electronic component body, a surface plate, moving means that moves the jig and the surface plate relatively in a direction perpendicular to a surface of the surface plate as well as in a direction parallel to the surface of the surface plate, and control means that controls the moving means to bring a conductive paste applied to an end portion including an end face of the electronic component body held by the jig into contact with the surface of the surface plate, thereby performing a blotting operation for transferring extra conductive paste to the surface plate. The control means causes the moving means to simultaneously perform a distance changing movement for changing the distance between the end face of the electronic component body and the surface of the surface plate and a position changing movement for changing a two-dimensional position where the end face of the electronic component body is projected on the surface of the surface plate in such a manner that the movement direction of the two-dimensional position successively varies in a plane parallel to the surface of the surface plate.

According to the aspect (11) of the disclosure, the electronic component manufacturing method according to the aspect (1) of the disclosure can be preferably implemented.

(12) Another aspect of the disclosure relates to an electronic component manufacturing apparatus that has a jig for holding a plurality of electronic component bodies, a surface plate, moving means that moves the jig and the surface plate relatively in a direction perpendicular to a surface of the surface plate as well in a direction parallel to the surface of the surface plate, and control means that controls the moving means to perform a blotting operation for bringing a conductive paste applied to an end portion including an end face of each of the plurality of electronic component bodies held by the jig into contact with the surface of the surface plate. The control means performs a height change operation for shortening the distance between the end face of each of the plurality of electronic component bodies and the surface of the surface plate and a position change operation for changing a two-dimensional position where the end face of each of the plurality of electronic component bodies is projected on the surface of the surface plate, by controlling the jig and the surface plate to move relatively.

According to the aspect (12) of the disclosure, the electronic component manufacturing method according to the aspect (5) of the disclosure can be preferably implemented.

(13) Another aspect of the disclosure relates to an electronic component manufacturing apparatus that includes a jig for holding a plurality of electronic component bodies, a surface plate, moving means that move the jig and the surface plate relatively in a direction perpendicular to a surface of the surface plate as well as in a direction parallel to the surface of the surface plate, and control means that controls the moving means to perform a coating operation for applying a conductive paste to an end portion of each of the plurality of electronic component bodies by bringing the end portion including the end face of each of the plurality of electronic component bodies held by the jig into contact with a dip layer of the conductive paste formed on the surface of the surface plate. The jig elastically holds the plurality of electronic component bodies so as to be movable in a direction perpendicular to the surface of the surface plate. The control means causes the jig and the surface plate to move relatively, thereby bringing the end face of each of the plurality of electronic component bodies into contact with the surface of the surface plate.

According to the aspect (13) of the disclosure, the electronic component manufacturing method according to the aspect (8) of the disclosure can be preferably implemented.

(14) In the aspect (13) of the disclosure, after the coating operation, the control means can perform a height change operation for shortening the distance between the end face of each of the plurality of electronic component bodies and the surface of the surface plate from which the dip layer has been removed and a position change operation for changing a two-dimensional position where the end face of each of the plurality of electronic component bodies is projected on the surface of the surface plate by controlling the jig and the surface plate to move relatively, thereby performing the blotting operation for bringing the conductive paste applied to the end portion of each of the plurality of electronic component bodies held by the jig into contact with the surface of the surface plate.

According to the aspect (14) of the disclosure, the electronic component manufacturing methods according to the aspects (9) and (10) of the disclosure can be preferably implemented.

Figure 2:
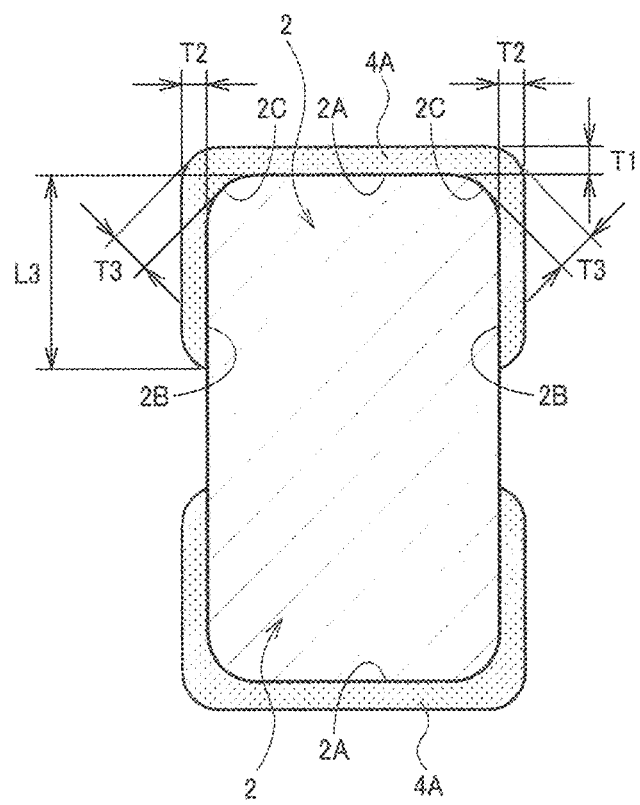
FIG. 2 is a cross-sectional view illustrating the electronic component illustrated in FIG. 1.

Exemplary embodiments are described below. Note that the following exemplary embodiments do not in any way limit the scope of the content defined by the claims laid out herein. Note also that all of the elements described in the present embodiment should not necessarily be taken as essential elements 1. Electronic Component FIG. 1 illustrates an electronic component 1A manufactured according to a manufacturing method according to an embodiment of the disclosure. FIG. 2 illustrates a cross section of a conductive layer 4A formed on an electronic component body 1. Here, the electronic component 1A to which the disclosure is applied is not particularly limited in size, but it is desired that the electronic component 1A is microminiaturized according to downsizing. As illustrated in FIG. 1, the microminiaturized electronic component 1A is rectangular (square or oblong) in cross section. When L1 represents the maximum length of one side of the rectangular cross section and L2 represents the length in a direction orthogonal to the rectangular cross section, L1 is 500 µm or less and L2 is 1000 µm or less. Preferably, L1 is 300 µm or less and L2 is 600 µm or less, and more preferably, L1 is 200 µm or less and L2 is 400 µm or less. Further preferably, L1 is 125 µm or less and L2 is 250 µm or less. The term "rectangle" as used herein includes not only the one in which a corner where two sides intersect is strictly 90° but also substantially rectangular shape in which a corner curved or chamfered. It is needless to say that the disclosure can also be applied to any other electronic component 1A that has a cross section of non-rectangular.

As illustrated in FIG. 2, at each end portion of the electronic component body 1, an electrode 4A being a conductive paste layer is formed on the electronic component 1A. Each end portion 2 of the electronic component body 1 includes an end face 2A, an end face 2B, and a corner portion 2C connecting the end face 2A and the end face 2B. Substantially uniform thickness T1 of the electrode 4A formed on the end face 2A and substantially uniform thickness T2 of the electrode 4A formed on the end face 2B can be substantially in a relationship of T1=T2. In addition, thickness T3 of the electrode 4A formed on the corner portion 2C can satisfy a relationship T3≥T1 or T3≥T2. Further, L3 represents the electrode length of the electrode 4A formed on the end face 2B extending from the end face 2A. A plurality of electronic components 1A, when manufactured according to the manufacturing method according to an embodiment of the disclosure, is required to have uniformity in dimensions (T1 to T3 and L3) of the electrode 4A.

2. Electronic Component Manufacturing Apparatus

Figure 3:
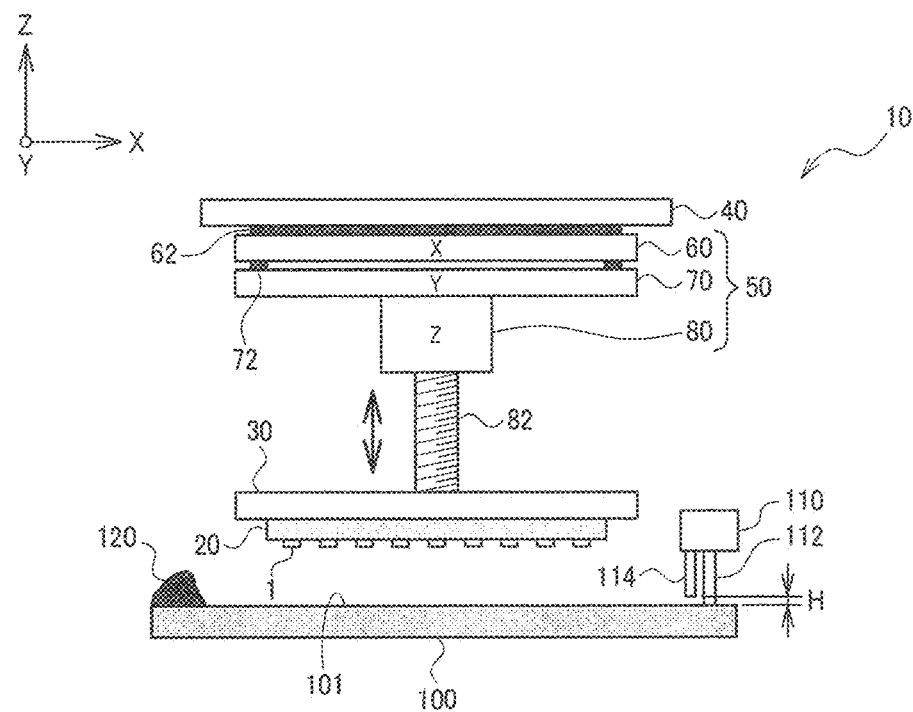
FIG. 3 is a diagram illustrating an electronic component manufacturing apparatus according to an embodiment of the disclosure.
Figure 4:
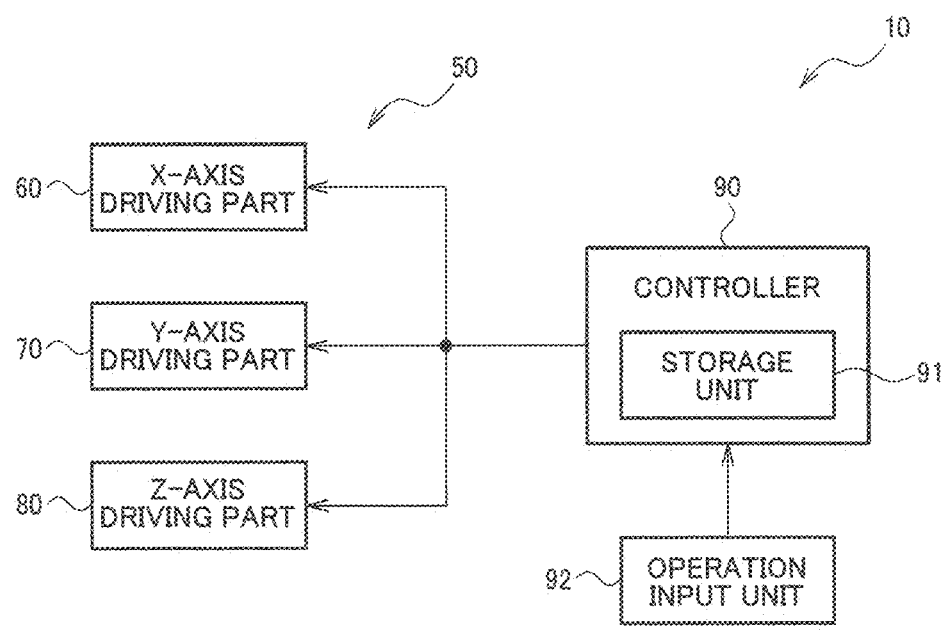
FIG. 4 is a block diagram illustrating the manufacturing apparatus illustrated in FIG. 3.

FIG. 3 illustrates a manufacturing apparatus 10 that can be used to implement the present embodiment. FIG. 4 is a block diagram illustrating a control system. The manufacturing apparatus 10 has a carrier plate (jig) 20, a transfer mechanism 50, and a surface plate 100. In FIG. 3, X, Y, and Z represent three orthogonal axial directions.

The carrier plate (jig) 20, which hangs and holds the electronic component bodies 1, elastically holds the electronic component bodies 1 so as to be movable in a direction perpendicular to a surface 101 of the surface plate 100. The carrier plate 20 can be configured, for example, by an adhesive tape that is elastically deformable in the Z direction. The carrier plate 20 is detachably supported by a jig fixing plate 30. A base 40 is fixed above the jig fixing plate 30, and the surface plate 100 is disposed below the jig fixing plate 30.

The surface plate 100 is provided with a squeegee unit 110 including a squeegee 112 and a blade 114. The squeegee unit 110 is movable on the surface plate 100. By moving the blade 114, the squeegee unit 110 can form a dip layer of a conductive paste 120 having height H on the surface 101 of the surface plate 100. By moving the squeegee 112, the squeegee unit 110 can scrape the dip layer of the conductive paste 120 from the surface 101 of the surface plate 100.

The base 40 is provided with the transfer mechanism 50 for moving the jig fixing plate 30. In the present embodiment, the transfer mechanism 50 can include an X-axis driving part 60, a Y-axis driving part 70, and a Z-axis driving part 80. The transfer mechanism 50 is not particularly limited if it can cause a relative movement between the jig fixing plate 30 and the surface plate 100 in the X-, Y-, and Z-axis directions. That is, the transfer mechanism 50 may be configured to move the surface plate 100. Alternatively, the transfer mechanism 50 may be configured to include not only the transfer mechanism for moving the jig fixing plate 30 but also another transfer mechanism for moving the surface plate 100. Alternatively, the transfer mechanism 50 may be configured such that at least one of the X-axis driving part 60, the Y-axis driving part 70, and the Z-axis driving part 80 causes the jig fixing plate 30 to move and the rest causes the surface plate 100 to move.

The X-axis driving part 60 can be configured by an X table movable in the X-axis direction with respect to the base 40 along an X-axis guide 62. The Y-axis driving part 70 can be configured by a Y table movable in the Y-axis direction with respect to the X-axis driving part 60 along a Y-axis guide 72. The Z-axis driving part 80 is fixed to, for example, the Y-axis driving part 70, and can move a Z shaft 82 in the Z-axis direction. The jig fixing plate 30 is fixed to the Z shaft 82. FIG. 3 does not include any illustration of X-, Y-, and Z-axis driving sources, such as motors, and driving force transmission mechanisms thereof.

Thus, the transfer mechanism 50 enables the jig fixing plate 30, the carrier plate 20, and the electronic component bodies 1 to move relative to the surface plate 100 not only in the Z-axis direction but also along an X-Y plane parallel to the surface of the surface plate 100.

As illustrated in FIG. 4, the manufacturing apparatus 10 has a controller 90 that controls the X-axis driving part 60, the Y-axis driving part 70, and the Z-axis driving part 80. The controller 90 is connected to an operation input unit 92 such as a keyboard or the like. The controller 90 includes a storage unit 91. The storage unit 91 stores operational information input via the operation input unit 92, programs registered in advance, and the like. The controller 90 controls the X-axis driving part 60, the Y-axis driving part 70, and the Z-axis driving part 80 according to data and programs stored in the storage unit 91. By using the X-axis driving part 60 and the Y-axis driving part 70, the controller 90 can cause the jig fixing plate 30 to move along, for example, a circular path in a plane parallel to the surface plate 100. Further, while the jig fixing plate 30 is moved along the circular path by the X-axis driving part 60 and the Y-axis driving part 70, the controller 90 can drive the Z-axis driving part 80 to raise or lower the jig fixing plate 30.

3. Electronic Component Manufacturing Method

The manufacturing apparatus 10 according to the present embodiment performs a coating process and subsequently performs a blotting process. The coating process is bringing the end portion 2 including the end face 2A of each of the electronic component bodies 1 held by the carrier plate 20 into contact with the dip layer of the conductive paste formed on the surface 101 of the surface plate 100 to coat the end portion 2 of each electronic component body 1 with the conductive paste. The blotting process is bringing the conductive paste applied to the end portion 2 of each of the electronic component bodies 1 held by the carrier plate 20 into contact with the surface 101 of the surface plate 100 to transfer extra conductive paste to the surface plate 100.

3.1. First Embodiment

Figure 5A:
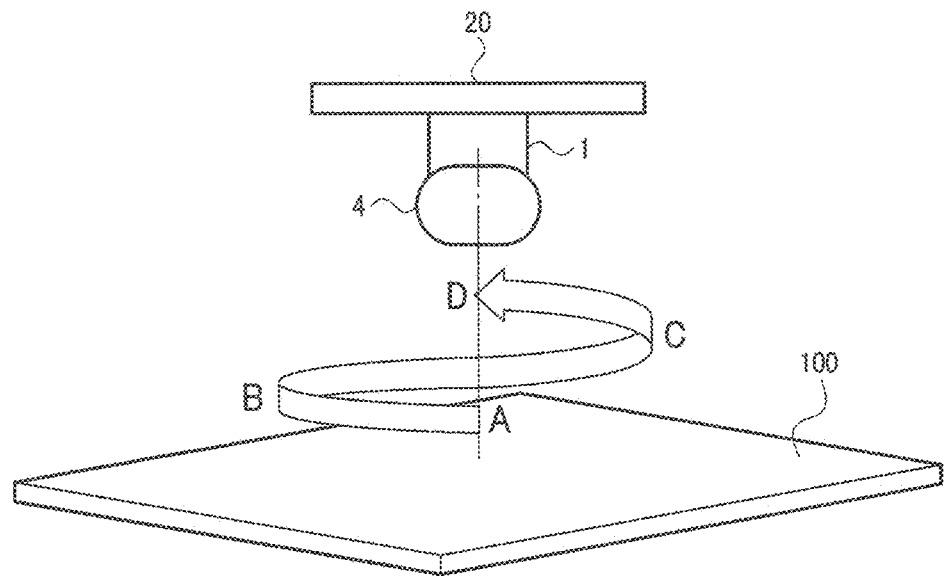
FIGS. 5A and 5B are diagrams illustrating an exemplary blotting process to be performed by the manufacturing apparatus illustrated in FIGS. 3 and 4.

FIG. 5A schematically illustrates a blotting process according to a first embodiment. FIG. 5A illustrates an example of relative movement of the surface plate 100 and the electronic component bodies 1 (although only one is illustrated in FIG. 5) held by the carrier plate 20 in the blotting process. In this blotting process, to implement a distance changing process for extending the distance between end face 2A of the electronic component body 1 and the surface 101 of the surface plate 100 and a position changing process for changing a two-dimensional position where the end face 2A of the electronic component body 1 is projected on the surface 101 of the surface plate 100 in such a manner that the movement direction of the two-dimensional position successively varies in a plane parallel to the surface 101 of the surface plate 100, the controller 90 controls the transfer mechanism 50 to cause the carrier plate 20 and the surface plate 100 to move relatively. That is, a projection of the end face 2A on the surface 101 moves its projected two-dimensional position on the surface 101.

FIG. 5A illustrates a spiral motion that is an example of the distance changing process and the position changing process. That is, the controller 90 simultaneously controls the X-axis driving part 60, the Y-axis driving part 70, and the Z-axis driving part 80 to raise the electronic component body 1 away from the surface plate 100 while causing the electronic component body 1 to turn in a loop orbit, such as a circle or an ellipse. FIG. 5A illustrates positions A to D during ascent of the electronic component body 1. In FIG. 5A, similar in FIGS. 5B and 12, the conductive paste layer formed at the end portion 2 of the electronic component body 1 is indicated by reference numeral 4 if the blotting process is not completed yet and by reference numeral 4A after the completion of the blotting process. Further, the conductive paste transferred to the surface plate 100 is denoted by reference numeral 4B.

FIGS. 6A to 6D illustrate blotting operations at respective positions A to D illustrated in FIG. 5A. In FIG. 6A, of the conductive paste layer 4 formed at the end portion of the electronic component body 1, the extra conductive paste 4B having been brought into contact with the surface plate 100 is transferred to the surface plate 100 while it is dragged toward the downstream side in a horizontal movement direction of the electronic component body 1, as illustrated in FIGS. 6B and 6C. At this time, while the position changing process is performed, the relative movement direction of the electronic component body 1 with respect to the surface plate 100 successively varies in the plane parallel to the surface plate 100. Although the conductive paste layer 4 of the electronic component body 1 is dragged by the conductive paste 4B transferred to the surface plate 100 or the surface plate 100, the conductive paste layer 4 is easily scraped off since the direction of dragging successively varies. In addition, the problem such that the extra conductive paste stays downstream in the movement direction does not occur as in the case of linear movement in which the relative movement direction does not successively vary. Therefore, the film thickness of the conductive paste layer 4A is not locally thickened. Further, when the end face 2A of the electronic component body 1 is rectangular, the extra conductive paste is easily collected at the corner portion 2C, and it becomes easy to secure the film thickness of the conductive paste at the corner portion 2C.

In the distance changing process according to the first embodiment, the electronic component body 1 relatively moves in a direction away from the surface plate 100 during the blotting process. Therefore, the amount of the conductive paste transferred to the surface plate 100 is reduced, and a relatively thick film thickness of the conductive paste of the electronic component body 1 can be secured.

3.2. Second Embodiment

Figure 5B:
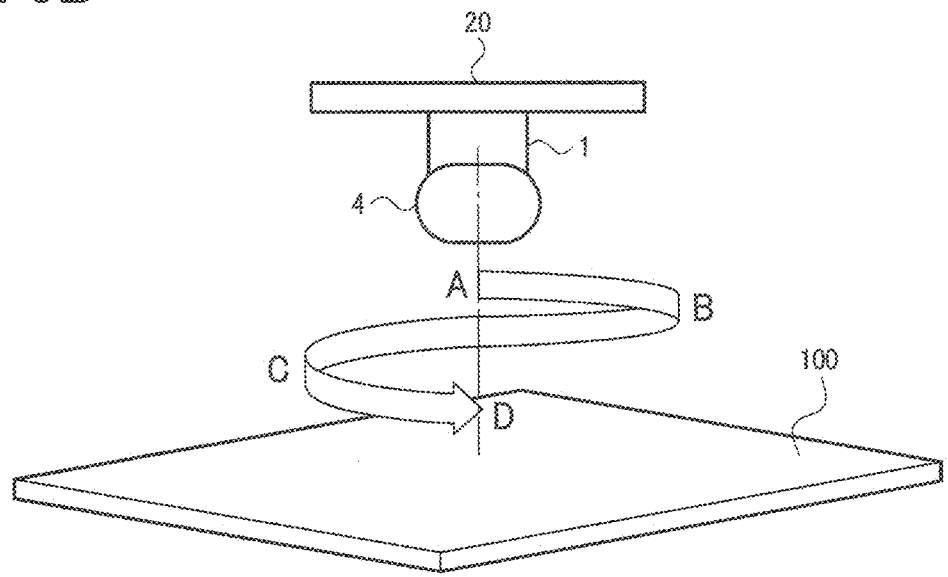

FIG. 5B schematically illustrates a blotting process according to a second embodiment. FIG. 5B is different from FIG. 5A only in that the distance change direction is the downward direction. That is, the controller 90 simultaneously controls the X-axis driving part 60, the Y-axis driving part 70, and the Z-axis driving part 80 to lower the electronic component body 1 in such a way as to approach the surface plate 100 while spirally turning. FIG. 5B illustrates respective positions A to D during descent of the electronic component body 1.

FIGS. 7A to 7D illustrate blotting operations at respective positions A to D illustrated in FIG. 5B. Even in the second embodiment, the position changing process is performed in the same manner as in the first embodiment. In a distance changing process according to the second embodiment, the electronic component body 1 relatively moves in a direction approaching the surface plate 100 during the blotting process. Therefore, the amount of the conductive paste transferred to the surface plate 100 is increased, and a relatively thin film thickness of the conductive paste of the electronic component body 1 can be secured.

According to the first and second embodiments described above, implementation of the distance changing process can adjust the amount of the conductive paste to be brought into contact with the surface plate 100 during the blotting process. Therefore, depending on the film thickness of the conductive paste to be secured for the electronic component body 1, the film thickness can be selectively adjusted by shortening (the first embodiment) or extending (the second embodiment) the distance in the distance changing process. This blotting process is such that the extra conductive paste is scraped off during the blotting process including the distance and position changing processes, and the conductive paste does not draw threads after the blotting process. Accordingly, since no trace of threads is left, the surface of the conductive paste layer 4A of the electronic component body 1 becomes flat.

In the position changing processes in the first and second embodiments, not only the loop locus such as a circular path, an elliptic path, or the like but also starting and end points of the position changing process in the plane parallel to the surface plate 100 do not necessarily coincide if the direction of the relative movement between the electronic component body 1 and the surface plate 100 successively varies in the plane parallel to the surface plate 100.

Figure 7A:
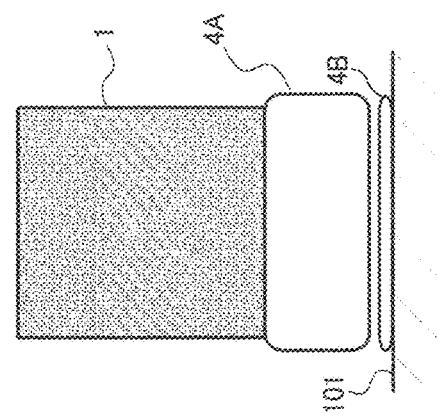
FIGS. 7A to 7D are diagrams illustrating, as the first embodiment of the disclosure, operations in the blotting process illustrated in FIG. 5B.
Figure 7B:
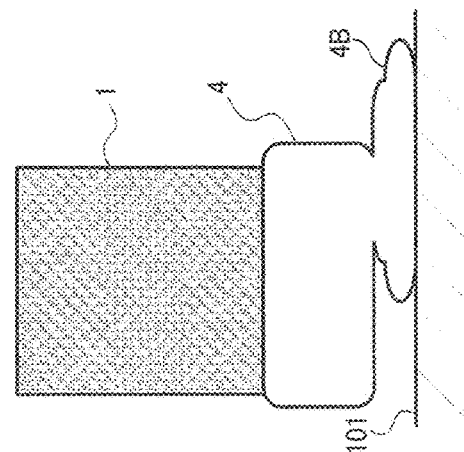
Figure 7C:
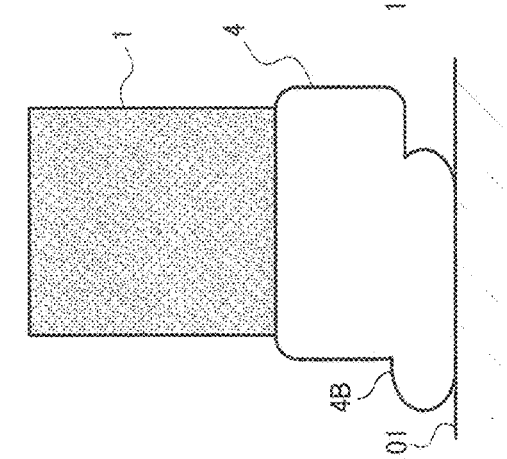
Figure 7D:
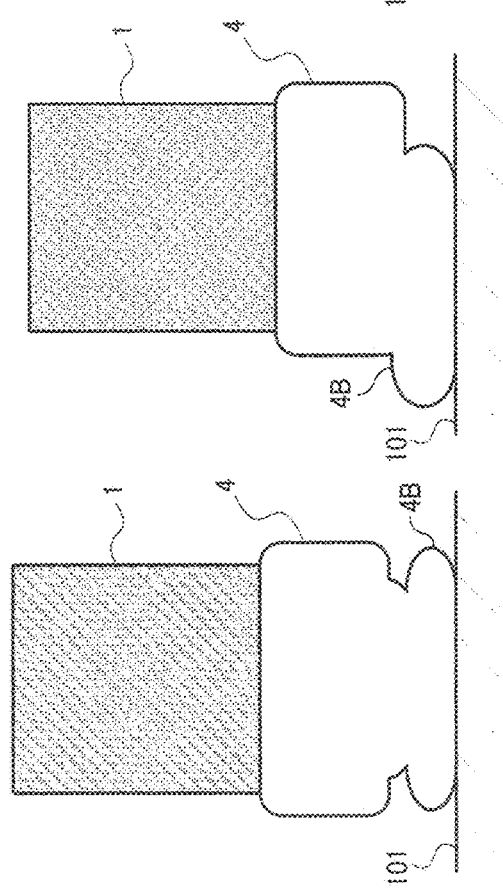
Figure 8A:
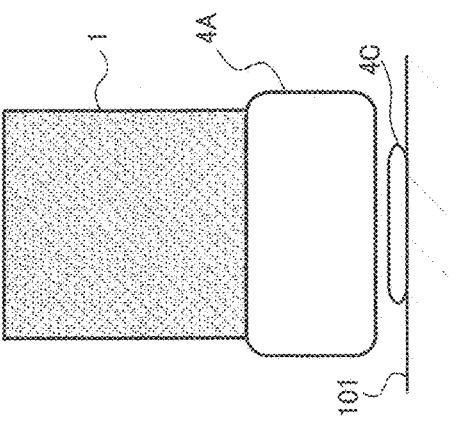
FIGS. 8A to 8D are diagrams illustrating, as a comparative example, operations in a blotting process in which no distance changing process is included.
Figure 8B:
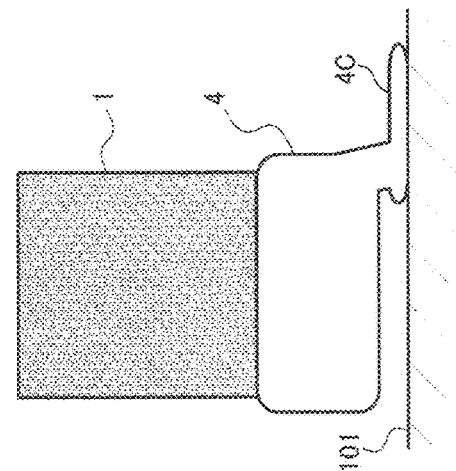
Figure 8C:
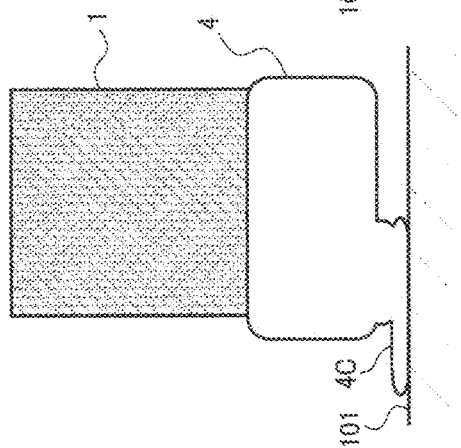
Figure 8D:
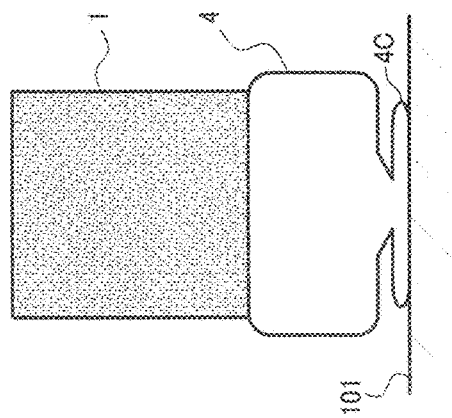

In addition, the blotting processes of the first and second embodiments illustrated in FIGS. 5A and 5B may be implemented in combination. First, each process according to the second embodiment illustrated in FIGS. 7A, 7B, and 7C is implemented. Before the state illustrated in FIG. 7D is obtained, the distance shortening process is stopped. Subsequently, each process according to the first embodiment illustrated in FIGS. 6B, 6C, and 6D is implemented to complete the blotting process. At this time, turn direction in the process illustrated in FIGS. 7A, 7B, and 7C and the turn direction in the process illustrated in FIGS. 6B, 6C, and 6D may be the same or opposite. When the blot process of FIGS. 5A and 5B is performed in combination, the thickness of the conductive paste layer 4A is different from the thickness of the conductive paste layer 4A obtained in the blot process of FIG. 5A or FIG. 5B. Accordingly, the freedom degree of the thickness of the conductive paste layer 4A spreads.

FIG. 8 illustrates a blotting process in a comparative example, in which extra conductive paste 4C is transferred to the surface plate 100 by implementing only the position changing process without implementing the distance changing process, while the electronic component body 1 and the surface plate 100 are kept constant in position in the vertical direction. In the blotting process illustrated in FIG. 8, the operations illustrated in FIGS. 6 and 7 cannot be performed. However, for example, if the conductive paste 4 applied to the electronic component body 1 leaves sharp protrusions, the blotting process illustrated in FIG. 8 is suitable for leveling the protrusions and shaping the surface of the conductive paste 4 into a flat shape.

Figure 9:
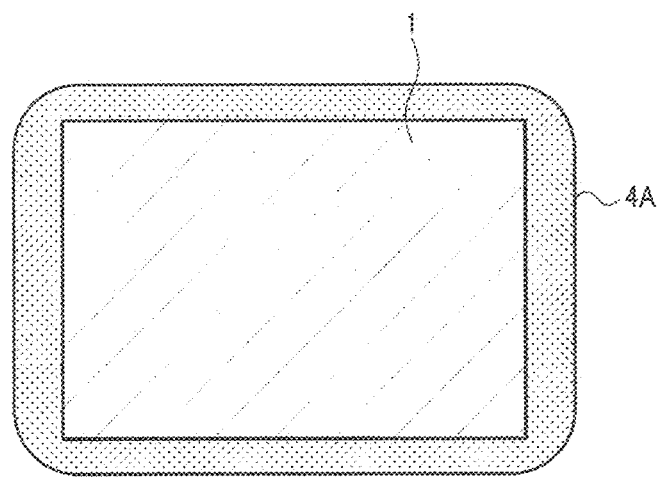
FIG. 9 is a cross-sectional view illustrating an electronic component body manufactured by performing the blotting process illustrated in FIG. 5A or FIG. 5B.

FIG. 9 illustrates a cross-sectional view of the electronic component body 1 obtained by implementing the blotting processes according to the first and second embodiments. As illustrated in FIG. 9, the conductive paste layer 4A formed on the electronic component body 1 has a uniform film thickness on four end faces 2B continuous from the end face 2A, and the necessary film thickness of the conductive paste layer 4A can be secured at the corner portion 2C.

3.3. Third Embodiment

A third embodiment uses the blotting process according to the second embodiment to simultaneously perform blotting process on the electronic component bodies 1.

3.3.1. Coating Process

Figure 10:
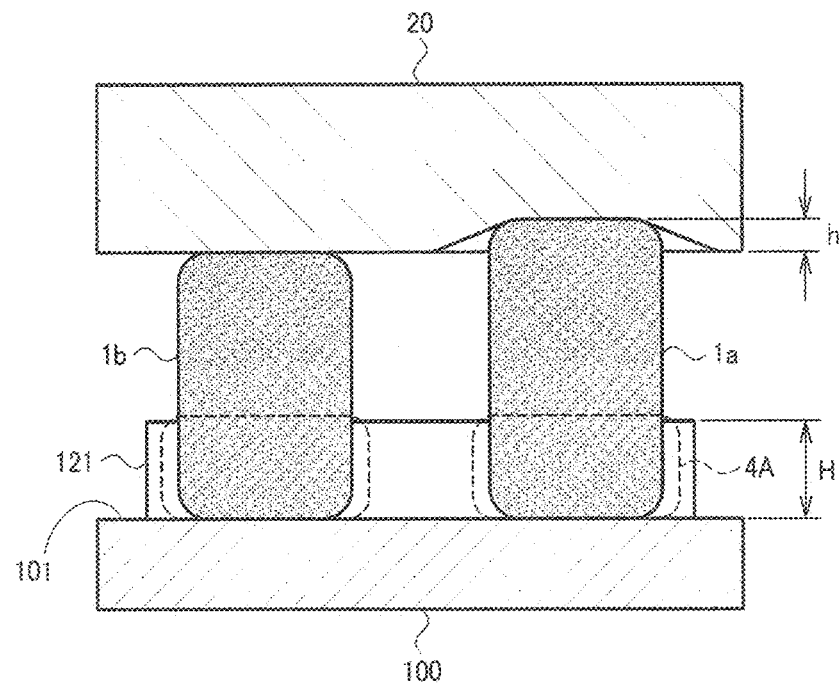
FIG. 10 is a diagram illustrating a coating process according to a third embodiment of the disclosure to be performed by the manufacturing apparatus illustrated in FIGS. 3 and 4.

FIG. 10 illustrates a coating process according to present embodiment. In the coating process, as illustrated in FIG. 10, a dip layer 121 of the conductive paste 120 (FIG. 3) is formed in advance on the surface 101 of the surface plate 100. Subsequently, the controller 90 controls the transfer mechanism 50 to relatively move the carrier plate 20 and the surface plate 100 in the Z direction, to bring the end face 2A of each of the electronic component bodies 1 into contact with the surface 101 of the surface plate 100. In the example illustrated in FIG. 10, a right electronic component body 1a is longer by h than a left electronic component body 1b. The variation h of the length of the electronic component body 1 is, for example, several tens of μm. Even in this case, the movement in the Z direction is continued after the end face 2A of the electronic component body 1a on the right side of FIG. 10 is brought into contact with the surface 101 of the surface plate 100. Therefore, the electronic component body 1a on the right side of FIG. 10 retracts upward due to elastic deformation of the carrier plate 20, while maintaining contact with the surface 101 of the surface plate 100. Then, the relative movement in the Z direction is continued until the end face 2A of the electronic component body 1b on the left side of FIG. 10 contacts the surface 101 of the surface plate 100. At this time, the carrier plate 20 and the surface plate 100 may be relatively moved in the Z direction by an over stroke amount by which the electronic component body 1b on the left side of FIG. 10 retracts upward due to the elastic deformation of the carrier plate 20 while maintaining the contact with the surface 101 of the surface plate 100. By bring the end face 2A of each of the plurality of electronic component bodies 1a and 1b into contact with the surface 101 of the surface plate 100 as illustrated in FIG. 10, the length of the coating formed on the end portion 2 of each of the plurality of electronic component bodies 1a and 1b coincides with the height H of the dip layer 121. As a result, the lengths L3 (FIG. 2) of the electrodes 4A formed on the end portion 2 of each of the electronic component bodies 1 are equalized, and the electrodes 4A become uniform in shape.

Figure 11:
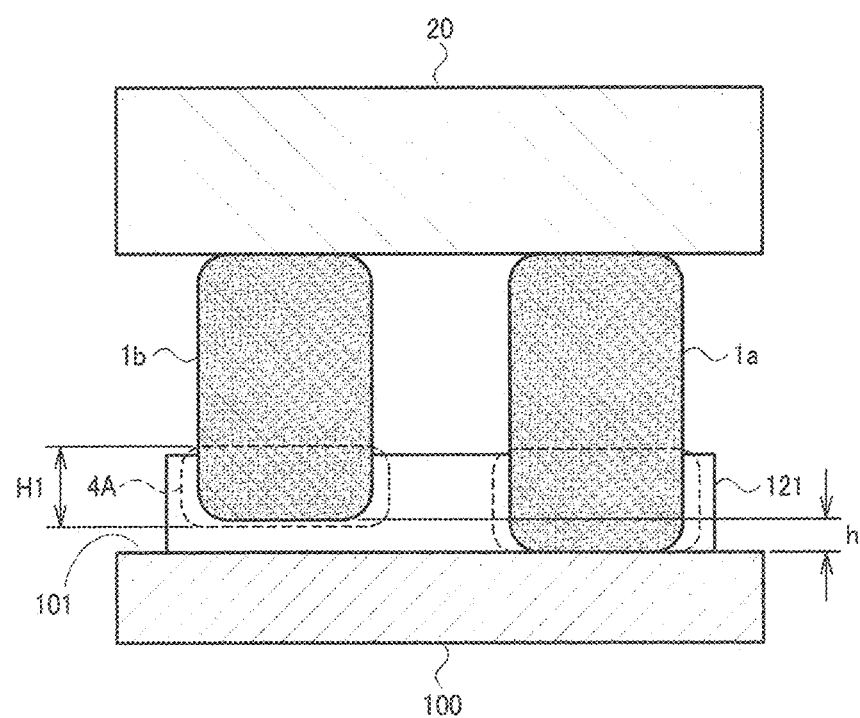
FIG. 11 is a diagram illustrating a coating process in a comparative example.

FIG. 11 illustrates a coating process in a comparative example. Unlike the carrier plate 20 illustrated in FIG. 10, a carrier plate 21 illustrated in FIG. 11 does not have a function of holding the electronic component body 1 so as to be elastically movable in the Z direction. In this case, the relative movement in the Z direction is stopped when the electronic component body 1a on the right side of FIG. 11 contacts the surface 101 of the surface plate 100. Therefore, the electronic component body 1b on the left of FIG. 11 is not in contact with the surface 101 of the surface plate 100, and the coating length of the electrode 4A formed on the end portion 2 becomes H1 (<H). Therefore, coating lengths of the electrodes 4A formed on the end portions 2 between the electronic component bodies 1 become irregular. According to the embodiments of the disclosure, it is possible to prevent the variation in coating length of the electrode 4A illustrated in FIG. 11.

3.3.2. Blotting Process

Figure 12:
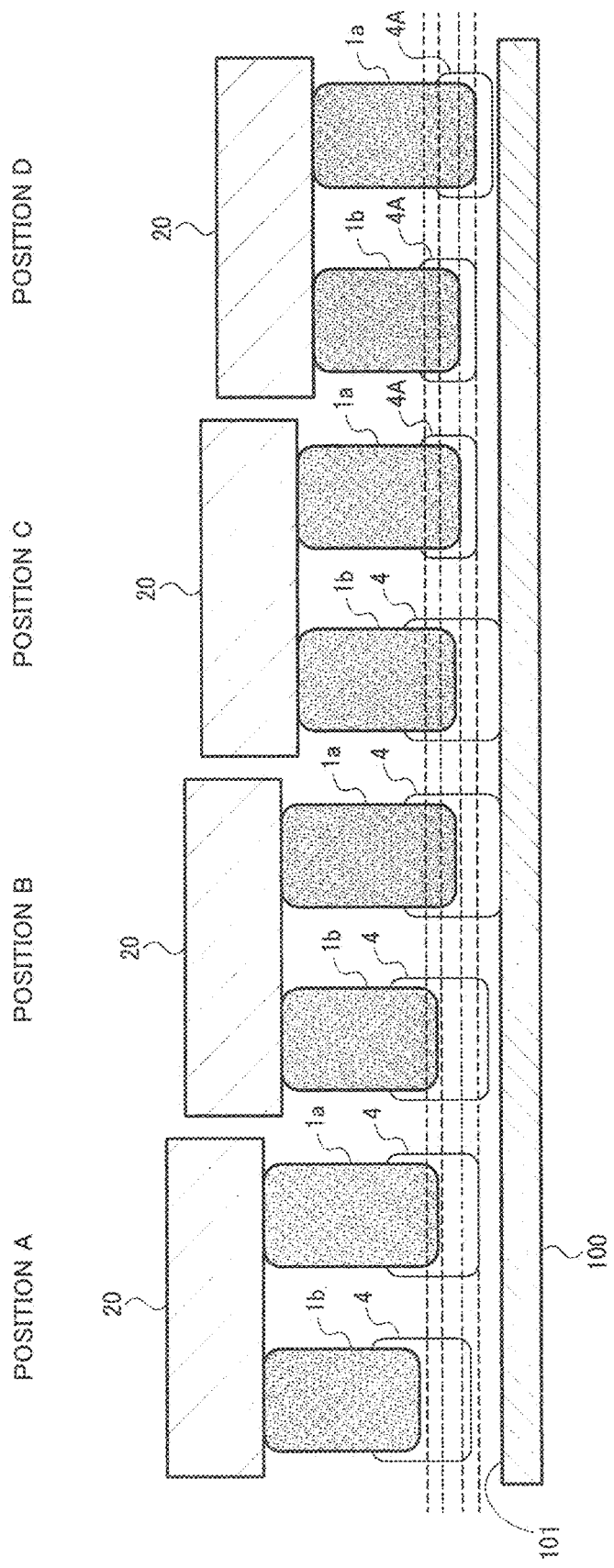
FIG. 12 is a diagram illustrating the state of conductive paste at respective descent positions during the blotting process according to the third embodiment of the disclosure illustrated in FIG. 5B.

In this third embodiment, the blotting process according to the second embodiment illustrated in FIG. 5B is employed. FIG. 12 illustrates the state of two electronic component bodies 1a and 1b different in length, during descent, at respective positions A to D illustrated in FIG. 5B. In FIG. 12, like in FIG. 10, the right electronic component body 1a is longer than the left electronic component body 1b.

At the position A in FIG. 5B, the conductive paste layers 4 of the electronic component bodies 1a and 1b do not reach the surface 101 of the surface plate 100, as illustrated in FIG. 12. At the position B in FIG. 5B where the height changing process has been performed, the conductive paste layer 4 of the electronic component body 1a reaches the surface 101 of the surface plate 100, as illustrated in FIG. 12. Subsequently, as the electronic component body 1a descends spirally, the conductive paste layer 4 contacts the surface 101 of the surface plate 100 while changing its position. As a result, the extra conductive paste is scraped off to the surface plate 100, and the conductive paste layer 4 remaining on the electronic component body 1a is shaped while forming threads with the conductive paste transferred to the surface plate 100. At the position C in FIG. 5B, the formation of threads by the electronic component body 1a terminates and the conductive paste layer 4A is left as a completion form of the blotting process, as illustrated in FIG. 12.

On the other hand, at the position C in FIG. 5B where the height changing process is further performed, as illustrated in FIG. 12, the conductive paste layer 4 of the electronic component body 1b reaches the surface 101 of the surface plate 100. Subsequently, as the electronic component body 1b descends spirally, the conductive paste layer 4 contacts the surface 101 of the surface plate 100 while successively changing its position. As a result, the extra conductive paste is scraped off to the surface plate 100, and the conductive paste layer 4 remaining on the electronic component body 1b is shaped while forming threads with the conductive paste transferred to the surface plate 100. At the position D in FIG. 5B, the formation of threads by the electronic component body 1b terminates and the conductive paste layer 4A is left as a completion form of the blotting process, as illustrated in in FIG. 12.

As described above, the implementation of the blotting process according to the present embodiment can equalize the thicknesses of the conductive paste layers 4A formed on end faces of the plurality of electronic component bodies 1a and 1b even when the plurality of electronic component bodies 1a and 1b vary in position of the end face 2A. As a result, the conductive paste layers 4A formed on the end portions 2 of the plurality of electronic component bodies 1a and 1b are made uniform in shape. Further, in this blotting process, the height changing process and the position changing process are simultaneously performed. By doing this, while the plurality of electronic component bodies 1a and 1b relatively move closer to the surface plate 100, the plurality of electronic component bodies 1a and 1b are relatively moved with the component in a direction parallel to the surface plate 100. Further, causing the plurality of electronic component bodies 1a and 1b to move relatively and spirally so as to approach the surface 101 of the surface plate 100 can efficiently implement the position changing process while minimizing the required area of the surface plate 100.

Although the present embodiments have been described in detail as mentioned above, it should be understood by those skilled in the art that many modifications can be made without departing substantially from the new matters and effects of the disclosure. Accordingly, all such modifications are intended to be included in the range of the disclosure.

For example, in the third embodiment of the disclosure, only one of the coating process illustrated in FIG. 10 and the blotting process illustrated in FIGS. 5B and 12 may be implemented. Through the coating process illustrated in FIG. 10, the length L3 (FIG. 2) of the coating formed on the end portion 2 of each of the plurality of electronic component bodies 1a and 1b coincides with the height H of the dip layer 121. Further, by implementing the blotting process illustrated in FIGS. 5B and 12, the thicknesses T1 (FIG. 2) of the conductive paste layers 4A formed on the end faces of the plurality of electronic component bodies 1a and 1b are made uniform. This is because the electrode 4A formed on the end portion 2 of each of the electronic component bodies 1 is independently made uniform in shape.

FIG. 13 illustrates representative evaluation data obtained by implementing the blotting processes in comparative examples 1 and 2 and the present embodiment for the electronic component bodies 1a and 1b different in length. The comparative example 1 uses the blotting process disclosed in JP-A-63-45813. The comparative example 2 uses the blotting process in which the electronic component body 1 is moved linearly with respect to the surface plate 100. Regarding the blotting processes in the comparative examples 1 and 2, the difference of the conductive paste layer 4a in TOP film thickness (film thickness T1 in FIG. 2) occurring due to the difference in length between the electronic component bodies 1a and 1b was as large as 7 to 8 μm. On the other hand, in the present embodiment, the difference in TOP film thickness of the conductive paste layer 4a was reduced to 2 μm. From this, the uniformization effect of the thickness T1 (FIG. 2) of the conductive paste layer 4A by the blotting process illustrated in FIGS. 5 and 12 is understood.

Further, the blotting process illustrated in FIGS. 5B and 12 may not necessarily use the carrier plate 20 used in the coating process illustrated in FIG. 10, because the blotting process does not require the elastic deformation of the carrier plate 20. Further, in the coating process illustrated in FIG. 10 and in the blotting process illustrated in FIGS. 5B and 12, it is unnecessary to use the same surface plate 100. A first surface plate may be used in the coating process illustrated in FIG. 10, and a second surface plate may be used in the blotting process illustrated in FIGS. 5B and 12.

In the blotting process according to the third embodiment of the disclosure, the height changing process and the position changing process may not necessarily be performed simultaneously. In short, the position changing process should be performed at positions different in the distance between the end face 2A of the electronic component body 1 and the surface of the surface plate 100. That is, at a plurality of positions different in height of the end face 2A of the electronic component body 1, the electronic component body 1 and the surface plate 100 may be relatively moved in the X-axis and/or Y-axis directions. Even when the height changing process and the position changing process are simultaneously performed, the movement is not limited to the spiral motion. The electronic component body 1 and the surface plate 100 may be relative moved in the X-axis and/or Y-axis direction while causing a relative movement in the Y-axis direction.

Further, after the coating process illustrated in FIG. 10, the coating state of the conductive paste layer 4 formed on the end portion 2 of respective electronic component bodies 1 may be imaged with a camera, and if the coating length (length from the end face 2A) on the end portion 2 of the electronic component bodies 1a and 1b is not within a predetermined range, such an electronic component body 1 may be excluded as a defective component.

In the above-mentioned first to third embodiments, it may be useful to apply a conductive paste on the surface 101 of the surface plate 100 before the blotting process to form a wet layer of the conductive paste on the surface 101 of the surface plate 100. In this case, in the blotting process, extra conductive paste on the electronic component body 1, 1a, or 1b is brought into contact with the wet layer formed on the surface of the surface plate. The extra conductive paste on the electronic component body 1, 1a, or 1b is easily transferred to the wet layer of the same conductive paste rather than a dry surface of the surface plate 100 mainly formed of metal. Alternatively, when the viscosity of the conductive paste is low, the amount of conductive paste transferred to the wet layer can be reduced.

What is claimed is:

1. An electronic component manufacturing method comprising:
    blotting by bringing a conductive paste applied to an end portion including an end face of an electronic component body held by a jig into contact with a surface of a surface plate, thereby transferring extra conductive paste to the surface plate,
    the blotting including simultaneous performance of:
    distance changing of changing a distance between the end face of the electronic component body and the surface of the surface plate, and
    position changing of changing a two-dimensional position where the end face of the electronic component body is projected on the surface of the surface plate in such a manner that the movement direction of the two-dimensional position successively varies on the surface of the surface plate during the blotting whereby the extra conductive paste is dragged along the surface plate during the position changing, thereby a direction of dragging the extra conductive paste on the electronic component body that is dragged by the surface plate successively varies.

2. The electronic component manufacturing method according to claim 1, wherein in the position changing, the movement locus of the two-dimensional position draws a loop, and in the blotting, the electronic component body is spirally moved relative to the surface of the surface plate.

3. The electronic component manufacturing method according to claim 1, wherein prior to the blotting, the conductive paste is applied to the surface of the surface plate to form a wet layer on the surface of the surface plate.

4. The electronic component manufacturing method according to claim 1, wherein the distance changing extends the distance between the end face of the electronic component body and the surface of the surface plate.

5. The electronic component manufacturing method according to claim 1, wherein the distance changing shortens the distance between the end face of the electronic component body and the surface of the surface plate.

6. The electronic component manufacturing method according to claim 1, wherein the distance changing extends the distance between the end face of the electronic component body and the surface of the surface plate, after shortening the distance between the end face of the electronic component body and the surface of the surface plate.

7. The electronic component manufacturing method according to claim 1, wherein the blotting is performed with a plurality of electronic component bodies being held by the jig.

8. The electronic component manufacturing method according to claim 5, further comprising coating by applying the conductive paste to the end portion of each of the plurality of electronic component bodies held by the jig by bringing the end portion including the end face of each of the plurality of electronic component bodies into contact with a dip layer of the conductive paste formed on the surface of the surface plate, wherein the coating includes bringing the end face of each of the plurality of electronic component bodies into contact with the surface of the surface plate by causing relative movement of the jig and the surface plate, the jig elastically holding the plurality of electronic component bodies so as to be movable in a direction perpendicular to the surface of the surface plate.

9. An electronic component manufacturing method comprising:

coating by applying conductive paste to an end portion including an end face of an electronic component body held by a jig into contact with a dip layer of the conductive paste, and blotting by bringing the conductive paste applied to the end portion of the electronic component body into contact with a surface of a surface plate, thereby transferring extra conductive paste to the surface plate, the blotting including simultaneous performance of:

distance changing of changing a distance between the end face of the electronic component body and the surface of the surface plate, and position changing of changing a two-dimensional position where the end face of the electronic component body is projected on the surface of the surface plate in such a manner that the movement direction of the two-dimensional position successively varies on the surface of the surface plate during the blotting, wherein the blotting is performed after the coating when the conductive paste is still wet.

10. The electronic component manufacturing method according to claim 9, wherein the dip layer of the conductive paste is formed on the surface plate, and the blotting occurs after removing the dip layer from the surface plate.

* * * * *